United States Patent
Wu et al.

(10) Patent No.: US 9,515,048 B2
(45) Date of Patent: Dec. 6, 2016

(54) METHOD FOR FABRICATING AN INTERPOSER

(71) Applicant: Siliconware Precision Industries Co., Ltd., Taichung (TW)

(72) Inventors: Wen-Kuang Wu, Taichung (TW); Tsung-Te Yuan, Taichung (TW); Chun-Hung Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/744,464

(22) Filed: Jun. 19, 2015

(65) Prior Publication Data

US 2016/0020190 A1   Jan. 21, 2016

(30) Foreign Application Priority Data

Jul. 18, 2014   (TW) .............................. 103124685 A

(51) Int. Cl.
*H01L 23/00*   (2006.01)
*H01L 21/78*   (2006.01)
*H01L 21/683*   (2006.01)
*H01L 23/522*   (2006.01)

(52) U.S. Cl.
CPC .......... *H01L 24/97* (2013.01); *H01L 21/6835* (2013.01); *H01L 21/6836* (2013.01); *H01L 21/78* (2013.01); *H01L 23/5226* (2013.01); *H01L 24/81* (2013.01); *H01L 24/14* (2013.01); *H01L 2224/16225* (2013.01); *H01L 2224/32225* (2013.01); *H01L 2224/73204* (2013.01); *H01L 2224/81002* (2013.01)

(58) Field of Classification Search
CPC ............ H01L 23/49816; H01L 23/481; H01L 23/49838; H01L 24/14; H01L 24/06; H01L 21/78; H01L 21/6836; H01L 21/6835; H01L 23/5226

See application file for complete search history.

(56) References Cited

U.S. PATENT DOCUMENTS

| 2014/0117538 A1* | 5/2014 | Chen ................. H01L 23/49827 257/737 |
| 2014/0127864 A1* | 5/2014 | Chuang ................... H01L 24/80 438/123 |
| 2015/0064850 A1* | 3/2015 | Yeh ......................... H01L 24/82 438/125 |

* cited by examiner

*Primary Examiner* — Alonzo Chambliss
(74) *Attorney, Agent, or Firm* — Mintz Levin Cohn Ferris Glovsky and Popeo, P.C.; Peter F. Corless; Steven M. Jensen

(57) ABSTRACT

A method for fabricating an interposer is provided, which includes the steps of: providing a substrate body having a chip mounting side and an opposite external connection side and a plurality of conductive through holes communicating the chip mounting side and the external connection side, wherein the chip mounting side of the substrate body is covered with a protection layer; performing a singulation process on the external connection side of the substrate body; bonding the substrate body to a carrier via the external connection side thereof; removing the protection layer; and removing the carrier to form a plurality of interposers, thereby simplifying the fabrication process and improving the product yield.

6 Claims, 7 Drawing Sheets

METHOD FOR FABRICATING AN INTERPOSER

CROSS-REFERENCES TO RELATED APPLICATIONS

This application claims under 35 U.S.C. §119(a) the benefit of Taiwanese Application No. 103124685, filed Jul. 18, 2014, the entire contents of which are incorporated herein by reference.

BACKGROUND OF THE INVENTION

1. Field of the Invention

The present invention relates to methods for fabricating interposers, and more particularly, to a method for fabricating an interposer so as to improve the product yield.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

FIG. 1 is a schematic cross-sectional view of a 3D chip stack package. Referring to FIG. 1, a silicon interposer 1 is provided. The silicon interposer 1 has a chip mounting side 10a, an external connection side 10b opposite to the chip mounting side 10a and having an RDL (redistribution layer) structure 101 formed thereon, and a plurality of through silicon vias (TSVs) 100 communicating the chip mounting side 10a and the external connection side 10b. A semiconductor chip 9 having a plurality of electrode pads 90 is disposed on the chip mounting side 10a of the silicon interposer 1 and the electrode pads 90 are electrically connected to the chip mounting side 10a of the silicon interposer 1 through a plurality of solder bumps 102. The electrode pads 90 have a small pitch therebetween. Further, an underfill 92 is formed between the semiconductor chip 9 and the chip mounting side 10a of the silicon interposer 1 for encapsulating the solder bumps 102, and an encapsulant 8 is formed on the chip mounting side 10a of the silicon interposer 1 for encapsulating the semiconductor chip 9. A packaging substrate 7 having a plurality of bonding pads 70 is disposed on the external connection side 10b of the silicon interposer 1 and the bonding pads 70 are electrically connected to the RDL structure 101 through a plurality of conductive elements 103 such as bumps. Further, an underfill 72 is formed between the packaging substrate 7 and the RDL structure 101 for encapsulating the conductive elements 103. The bonding pads 70 of the packaging substrate 7 have a large pitch therebetween.

FIGS. 1A to 1F are schematic cross-sectional and perspective views showing a method for fabricating a silicon interposer according to the prior art.

Referring to FIG. 1A, a wafer 10 that has gone through a wiring process but is not singulated is provided. The wafer 10 consists of a plurality of silicon interposers 1 of FIG. 1F (detailed structure of the wafer 10 can refer to FIG. 1F). The chip mounting side 10a of the wafer 10 is covered with a protection layer 110 of a support member 11 and the solder bumps 102 are embedded in the protection layer 110.

Referring to FIG. 1B, the wafer 10 is bonded to a first adhesive film 120 of a first carrier 12 via the external connection side 10b thereof, and the conductive elements 103 are embedded in the first adhesive film 120.

Referring to FIG. 1C, the support member 11 and the protection layer 110 of the support member 11 are removed to expose the chip mounting side 10a of the wafer 10.

Referring to FIG. 1C-1, a pre-cutting process is performed on the first adhesive film 120 so as to form a plurality of V-shaped pre-cutting paths 121 on the first adhesive film 120.

Referring to FIG. 1C-2, the chip mounting side 10a of the wafer 10 is fixed by a mechanical arm 5 through such as vacuum adsorption.

Referring to FIG. 1C-3, the overall structure is turned upside down and then the mechanical arm 5 is removed. Thereafter, the overall structure is positioned through the pre-cutting paths 121 and fixed on a positioning plate 4 via the chip mounting side 10a. Subsequently, the first adhesive film 120 is cured.

Referring to FIG. 1C-4, the first carrier 12 is fixed by another mechanical arm 5' through such as vacuum adsorption.

Referring to FIG. 1C-5, the positioning plate 4 is removed and a second carrier 13 is bonded to the chip mounting side 10a of the wafer 10 through a second adhesive film 130. The solder bumps 102 are embedded in the second adhesive film 130.

Referring to FIG. 1D, the mechanical arm 5' and the first carrier 12 are removed, and the first adhesive film 120 is removed through the precutting paths 121.

Referring to FIG. 1E, a singulation process is performed. In particular, by using a laser machine 6, a stealth dicing process is performed on the external connection side 10b of the wafer 10, thereby forming a plurality of silicon interposers 1.

Referring to FIG. 1F, the silicon interposers 1 are taken out by a mechanical arm (not shown).

In the above-described method, if the wafer 10 is singulated by laser from the chip mounting side 10a, specific wiring on the chip mounting side 10a of the wafer 10 will prevent a laser beam from passing therethrough. Hence, after the support member 11 and the protection layer 110 are removed, a process of remounting the second carrier 13 to the chip mounting side 10a of the wafer 10 through the second adhesive film 130 is required so as to allow the external connection side 10b of the wafer 10 to face up for singulation.

However, such a remounting process is quite complicated and needs a lot of steps (as shown in FIGS. 1C-1 to 1C-5). Consequently, the wafer 10, which has a thickness of only 100 um, easily cracks or falls off when it is, for example, turned upside down and positioned in FIG. 1C-3, and a delamination easily occurs to the second adhesive film 130 when the first adhesive film 120 is removed in the process of FIG. 1D. As such, the product yield is reduced and the fabrication cost is increased.

Therefore, there is a need to provide a method for fabricating an interposer so as to overcome the above-described drawbacks.

SUMMARY OF THE INVENTION

In view of the above-described drawbacks, the present invention provides a method for fabricating an interposer, which comprises the steps of: providing a substrate body having a chip mounting side and an opposite external connection side and a plurality of conductive through holes communicating the chip mounting side and the external connection side, wherein the chip mounting side of the substrate body is covered with a protection layer; performing a singulation process on the external connection side of the substrate body; bonding the substrate body to a carrier via the external connection side thereof; removing the protection layer; and removing the carrier to form a plurality of interposers.

In the above-described method, the substrate body can be a semiconductor plate.

In the above-described method, the substrate body can be of a wafer type.

In the above-described method, the interposer can be of a chip type.

In the above-described method, the interposer can be electrically connected to a packaging substrate through the external connection side thereof and electrically connected to a chip through the chip mounting side thereof.

In the above-described method, the singulation process can be performed by using stealth dicing.

According to the present invention, the singulation process is performed before the protection layer is removed. As such, the present invention dispenses with the conventional process of remounting a carrier on the chip mounting side of the substrate body, thereby overcoming the conventional drawbacks such as cracking of the substrate body and delamination of an adhesive film and increasing the product yield.

Further, by dispensing with the conventional remounting process, the present invention reduces the process time and cost and increases the process efficiency.

Furthermore, by dispensing with the conventional remounting process, the present invention reduces the risk of damage to the substrate body when the substrate body is transferred on a production line.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

FIGS. 2A to 2E are schematic cross-sectional views showing a method for fabricating an interposer 2 according to the present invention.

Figure 2A:
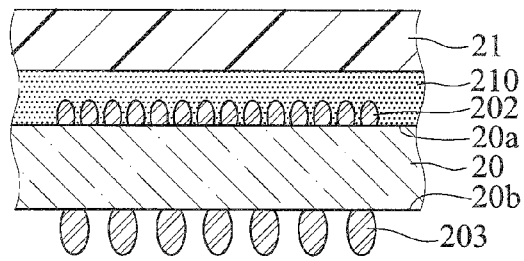
FIGS. 2A to 2E are schematic cross-sectional views showing a method for fabricating an interposer according to the present invention.

Referring to FIG. 2A, a substrate body 20 is provided. The substrate body 20 has a chip mounting side 20a, an opposite external connection side 20b and a plurality of conductive through holes 200 (as shown in FIG. 2E) communicating the chip mounting side 20a and the external connection side 20b. Further, the chip mounting side 20a of the substrate body 20 is covered with a protection layer 210 of a support member 21.

In the present embodiment, the substrate body 20 is of a silicon wafer type and not singulated. In particular, retelling to FIG. 2E, an RDL structure 201 is formed on the external connection side 20b of the substrate body 20 and a plurality of conductive elements 203 are further formed on the RDL structure 201, and a plurality of solder bumps 202 are formed on the conductive through holes 200 on the chip mounting side 20a of the substrate body 20.

Further, the solder bumps 202 are embedded in the protection layer 210.

Figure 2B:
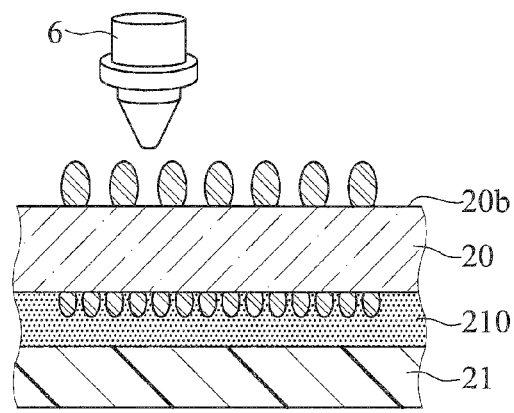

Referring to FIG. 2B, the overall structure is turned upside down so as for a singulation process to be performed on the external connection side 20b of the substrate body 20.

In the present embodiment, a stealth cutting process is performed on the external connection side 20b of the substrate body 20 by using a laser machine 6.

Figure 2C:
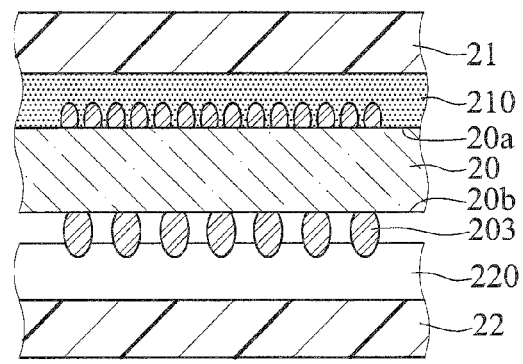

Referring to FIG. 2C, the substrate body 20 is bonded to an adhesive film 220 of a carrier 22 via the external connection side 20b thereof.

In the present embodiment, the conductive elements 203 are embedded in the adhesive film 220.

Figure 2D:
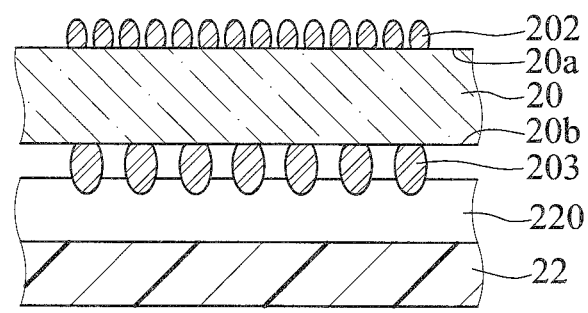
Figure 2E:
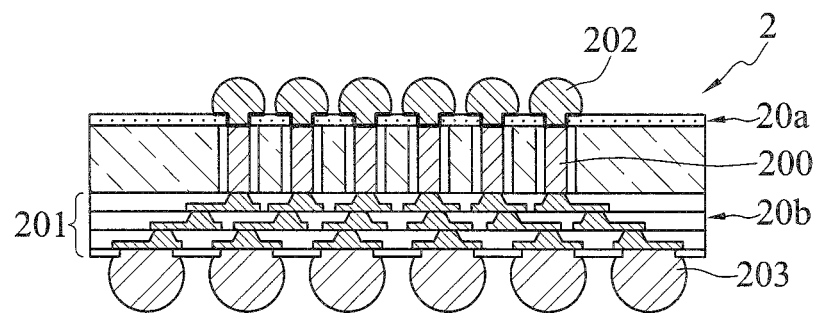

Referring to FIG. 2D, the support member 21 and the protection layer 210 of the support member 21 are removed to expose the chip mounting side 20a and the solder bumps 202.

Referring to FIG. 2E, the carrier 22 and the adhesive film 220 of the carrier 22 are removed, thereby forming a plurality of interposers 2.

Figure 1:
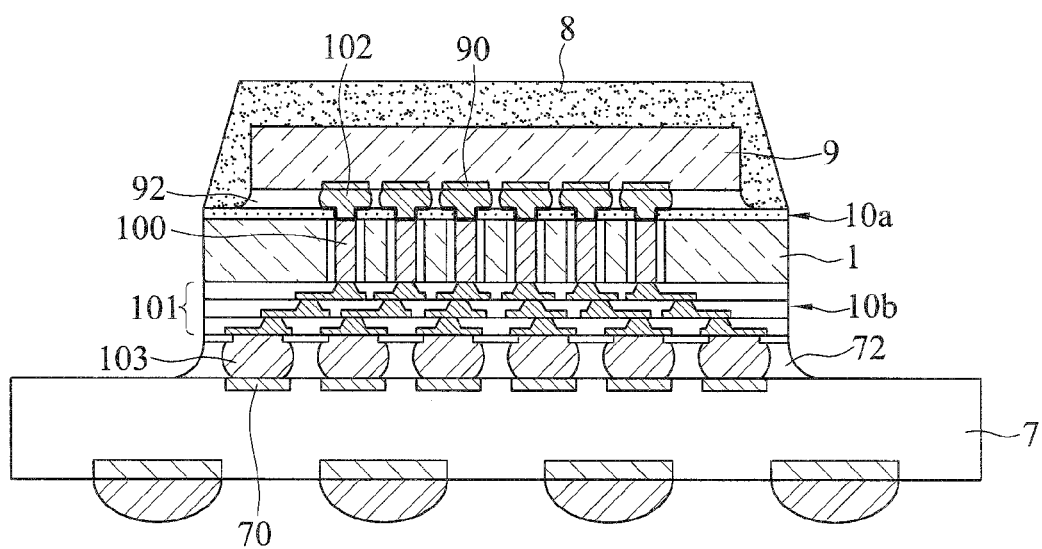
FIG. 1 is a schematic cross-sectional view of a conventional semiconductor package.
Figure 1A:
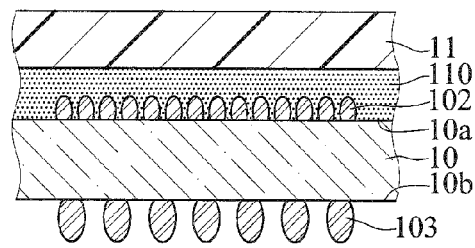
FIGS. 1A to 1F are schematic cross-sectional and perspective views showing a method for fabricating a silicon interposer according to the prior art.
Figure 1B:
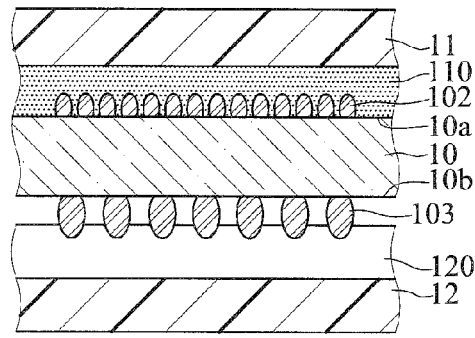
Figure 1C:
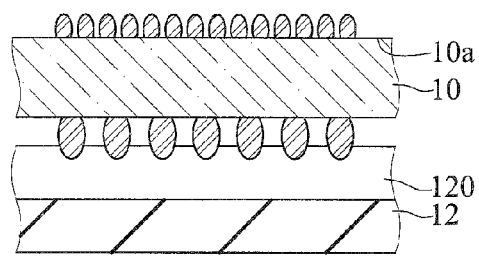
Figures 1, 1C:
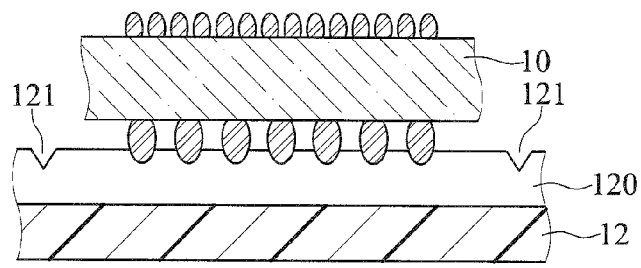
Figures 1, 1C, 2:
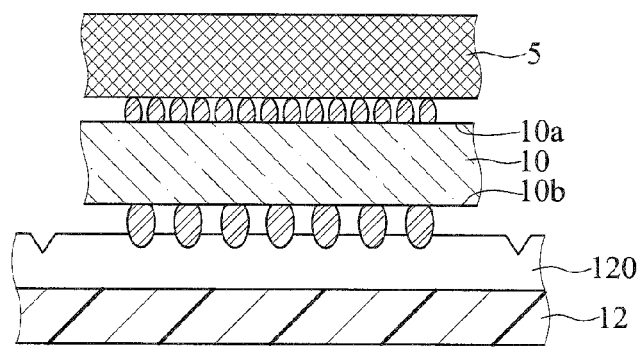
Figures 1, 1C, 2, 3:
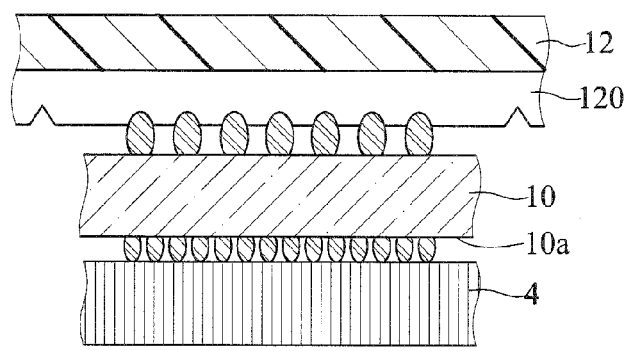
Figures 1, 1C, 2, 3, 4:
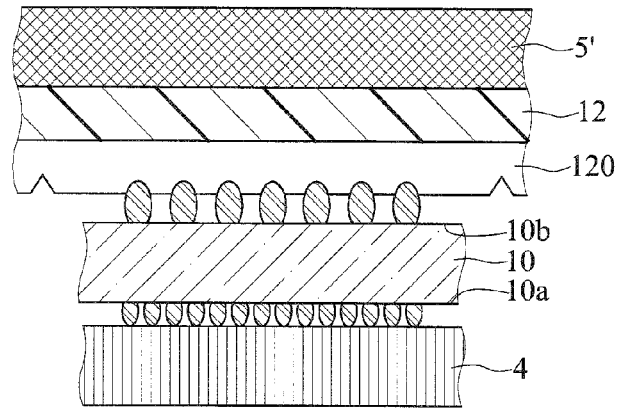
Figures 1, 1C, 2, 3, 4, 5:
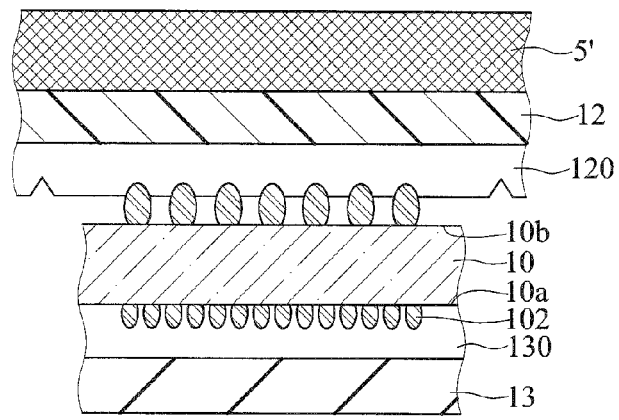
Figure 1D:
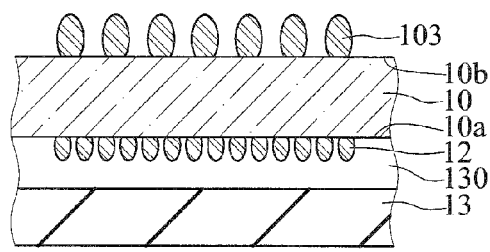
Figure 1E:
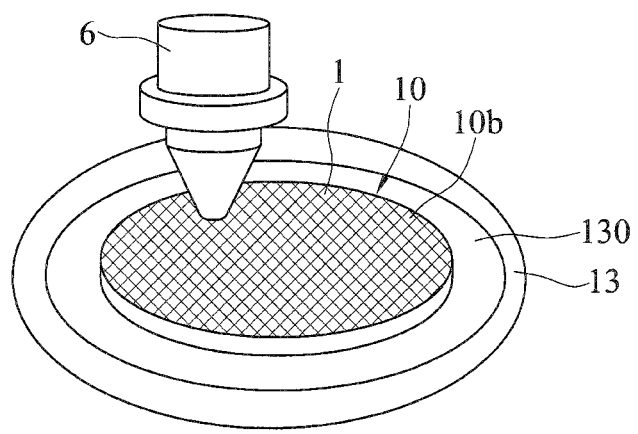
Figure 1F:
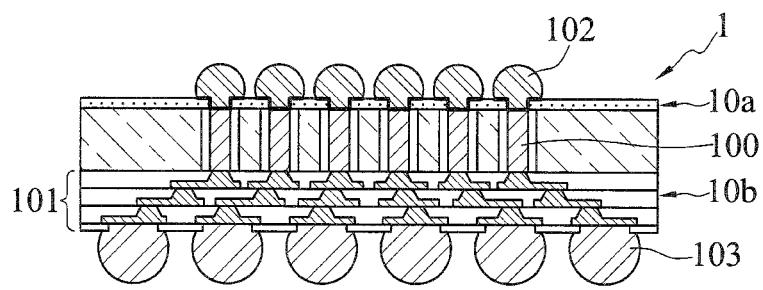

In the present embodiment, the interposer 2 is of a chip type and serves as a silicon interposer. The interposer 2 is electrically connected to a packaging substrate (such as the packaging substrate 7 of FIG. 1) through the external connection side 20b thereof and electrically connected to a chip (such as the semiconductor chip 9 of FIG. 1) through the chip mounting side 20a thereof.

According to the present invention, the substrate body 20 is singulated before the support member 21 and the protection layer 210 are removed. Therefore, the present invention dispenses with the conventional remounting process (i.e., the second carrier 13 is bonded to the chip mounting side 10a of the wafer 10 through the second adhesive film 130), thereby overcoming the conventional drawbacks, simplifying the fabrication process, reducing the process time and cost, and increasing the product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating an interposer, comprising the steps of:
   providing a substrate body having a chip mounting side and an opposite external connection side and a plurality of conductive through holes communicating the chip mounting side and the external connection side, wherein the chip mounting side of the substrate body is covered with a protection layer;
   performing a singulation process on the external connection side of the substrate body;

after performing the singulation process, bonding the substrate body to a carrier via the external connection side thereof;

removing the protection layer; and removing the carrier to form a plurality of interposers.

2. The method of claim 1, wherein the substrate body is a semiconductor plate.

3. The method of claim 1, wherein the substrate body is of a wafer type.

4. The method of claim 1, wherein the interposer is of a chip type.

5. The method of claim 1, wherein the interposer is electrically connected to a packaging substrate through the external connection side thereof and electrically connected to a chip through the chip mounting side thereof.

6. The method of claim 1, wherein the singulation process is performed by using stealth dicing.

\* \* \* \* \*